(12) United States Patent
Deutschmann et al.

(10) Patent No.: US 7,738,222 B2
(45) Date of Patent: Jun. 15, 2010

(54) CIRCUIT ARRANGEMENT AND METHOD FOR PROTECTING AN INTEGRATED SEMICONDUCTOR CIRCUIT

(75) Inventors: Bernd Deutschmann, Munich (DE); Bernd Fankhauser, Graz (AT); Michael Mayerhofer, Graz (AT); Pawel Chojecki, Graz (AT)

(73) Assignee: Austriamicrosystems AG, Unterpremstaetten (AT)

( * ) Notice: Subject to any disclaimer, the term of this patent is extended or adjusted under 35 U.S.C. 154(b) by 513 days.

(21) Appl. No.: 10/588,984

(22) PCT Filed: Feb. 14, 2005

(86) PCT No.: PCT/EP2005/001476

§ 371 (c)(1),
(2), (4) Date: Nov. 21, 2006

(87) PCT Pub. No.: WO2005/078798

PCT Pub. Date: Aug. 25, 2005

(65) Prior Publication Data

US 2008/0285199 A1      Nov. 20, 2008

(30) Foreign Application Priority Data

Feb. 13, 2004   (DE) .................... 10 2004 007 241
Nov. 22, 2004   (DE) .................... 10 2004 056 222

(51) Int. Cl.
*H02H 9/00* (2006.01)
*H02H 3/20* (2006.01)
*H02H 9/04* (2006.01)
*H02H 3/22* (2006.01)
*H02H 1/00* (2006.01)
*H02H 1/04* (2006.01)
*H02H 9/06* (2006.01)

(52) U.S. Cl. .................... 361/56; 361/91.1; 361/111; 361/118

(58) Field of Classification Search ............ None
See application file for complete search history.

(56) References Cited

U.S. PATENT DOCUMENTS 5,982,601 A * 11/1999 Lin ............... 361/111
6,091,593 A *  7/2000 Lin ............... 361/111

(Continued)

FOREIGN PATENT DOCUMENTS

CN          1236485 A       11/1999

(Continued)

OTHER PUBLICATIONS

Examination report with translation for Korean Application 10-2006-7016180.

(Continued)

*Primary Examiner*—Stephen W Jackson
*Assistant Examiner*—Dharti H Patel
(74) *Attorney, Agent, or Firm*—Fish & Richardson P.C.

(57) ABSTRACT

A circuit arrangement for protecting an integrated semiconductor circuit includes a protection circuit connected between an element to be protected and a reference potential. The protection circuit includes a thyristor structure. The circuit arrangement also includes a control circuit configured to drive the protection circuit by generating a plurality of control signals drive an active element of the protection circuit.

20 Claims, 4 Drawing Sheets

U.S. PATENT DOCUMENTS

| | | | |
|---|---|---|---|
| 6,177,298 B1 * | 1/2001 | Quigley | 438/135 |
| 6,233,130 B1 * | 5/2001 | Lin | 361/118 |
| 6,465,848 B2 * | 10/2002 | Ker et al. | 257/355 |
| 6,469,325 B1 | 10/2002 | Ishizuka et al. | 257/173 |
| 6,552,886 B1 * | 4/2003 | Wu et al. | 361/56 |
| 6,618,233 B1 * | 9/2003 | Russ et al. | 361/111 |
| 6,747,861 B2 * | 6/2004 | Ker et al. | 361/111 |
| 6,803,633 B2 * | 10/2004 | Mergens et al. | 257/358 |
| 7,064,393 B2 * | 6/2006 | Mergens et al. | 257/360 |
| 7,212,387 B2 * | 5/2007 | Duvvury et al. | 361/56 |
| 7,295,411 B2 * | 11/2007 | Arai et al. | 361/56 |
| 7,440,248 B2 * | 10/2008 | Arai et al. | 361/56 |
| 7,545,614 B2 * | 6/2009 | Traynor et al. | 361/56 |
| 2008/0285199 A1 | 11/2008 | Deutschmann et al. | 361/111 |

FOREIGN PATENT DOCUMENTS

| | | |
|---|---|---|
| CN | 1402346 A | 3/2003 |
| DE | 102004007241 | 9/2005 |
| DE | 102004029008 | 1/2006 |
| EP | 0 822 596 | 2/1998 |
| JP | 2003-526200 | 2/2003 |
| KR | 2000-0008809 | 5/2000 |
| WO | WO01/11685 | 2/2001 |

OTHER PUBLICATIONS

Examination report for corresponding application EP05707380.1.

Ming-Dou Ker et al SCR Device with Double-Triggered Technique for On-Chip ESD Protection in Sub-Quarter-Micron Silicided CMOS Processes, IEEE Trans. on Device and Materials Reliability, vol. 3., No. 3, Sep. 2003; XP 002346581.

English translation of Written Opinion for PCT/EP2005/001476.

Azais et al., "A Novel SCR-based Protection Structure Against ESD with Efficient Multi-finger Triggering", LIRMM, University Montpellier 11/CNRS, Montpellier, France STMicroelectronics, Central R&D, Crolles, France.

* cited by examiner

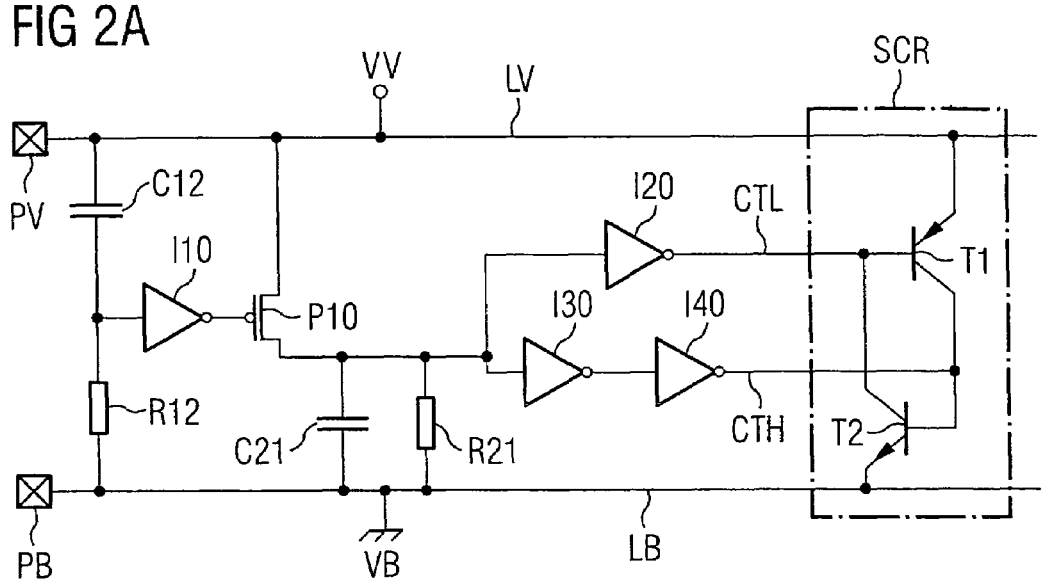
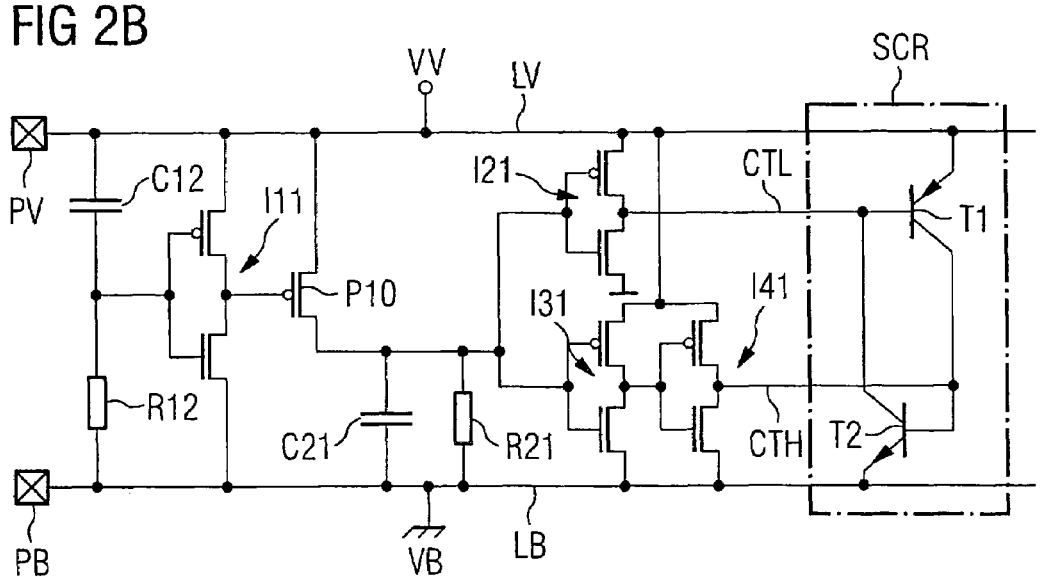

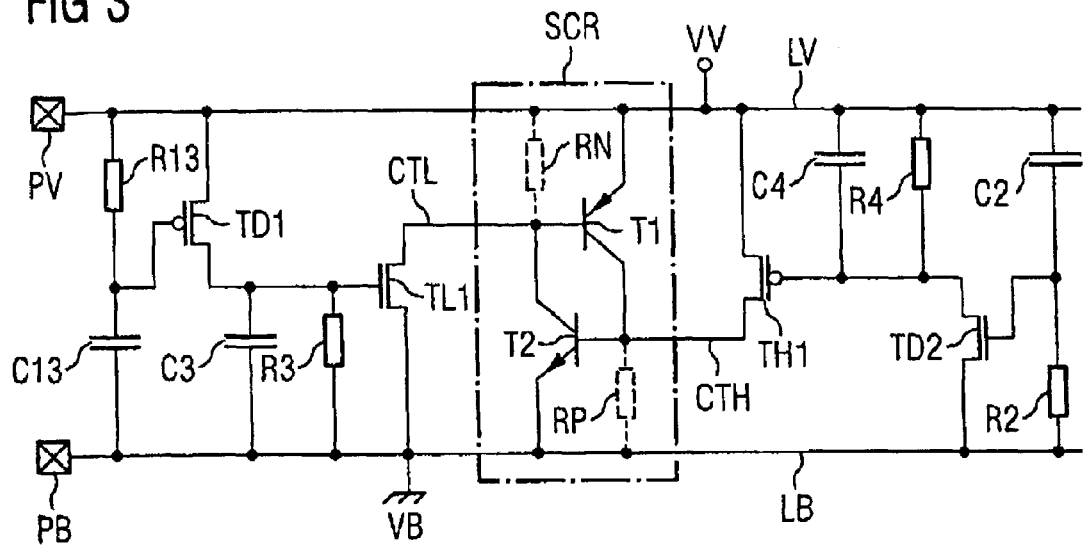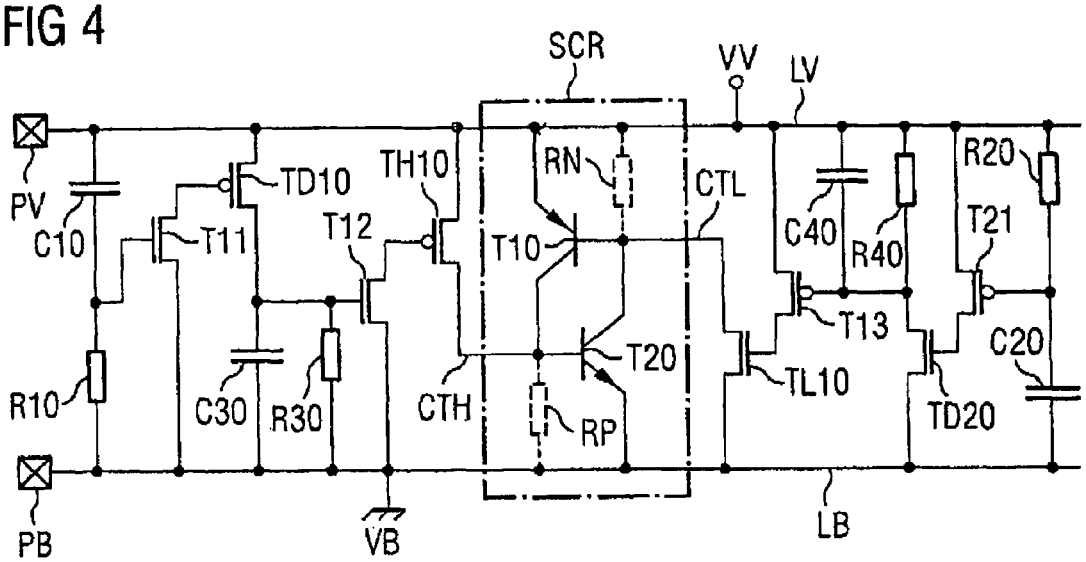

CIRCUIT ARRANGEMENT AND METHOD FOR PROTECTING AN INTEGRATED SEMICONDUCTOR CIRCUIT

TECHNICAL FIELD

This patent application describes a circuit arrangement for protecting an integrated semiconductor circuit comprising a protection circuit, which contains a thyristor structure and is connected between an element to be protected and a reference potential, and comprising a control circuit for driving the protection circuit, and also to a corresponding method for protecting an integrated semiconductor circuit.

BACKGROUND

Integrated semiconductor circuits (ICs) can be damaged by transient pulses or overvoltages, which are coupled in via terminals (pads) or directly in lines, such that they become nonfunctional or are even destroyed. Such pulses or overvoltages may occur for example in the event of so-called electrostatic discharges (ESD). High voltages and high currents, associated with transient or ESD disturbances, cause high disturbing powers to occur.

Such a pulse (e.g. burst) may also occur in many fields of application, e.g. automotive engineering. In automotive engineering, by way of example, there is the requirement that circuits of this type which have to function in the high-voltage range up to 90 volts or above are also to be designed for significantly higher disturbance pulse levels.

For high-voltage applications produced by means of high-voltage processes, provision is usually made of protection devices that are initiated or triggered by an electrical breakdown. The breakdown voltages must be significantly greater than the maximum permissible operating voltages of the application circuit to be protected. Only then is it possible to guarantee an undisturbed functionality of the integrated circuit. In the case of a fault, e.g. when an impermissibly high voltage is present, this overvoltage is dissipated to reference potential or ground by the protection circuit and downstream assemblies are thus protected from the high voltage.

One alternative for such breakdown-based protection concepts is an active circuit for protecting an integrated circuit, comprising a combination of an active trigger circuit with a known protection device such as a thyristor or a bipolar or MOS protection transistor.

Active circuits for protecting the IC are often triggered by the rise of the transient signal. In this case, the signal rise per unit time is detected and a protection transistor or a protection circuit is turned on by means of a drive circuit.

In the case of a fault, the protection circuit may accordingly be understood as an actively triggered overvoltage or overcurrent surge arrestor. A fast activation of the protection circuit is necessary in the case of a fault.

Short switch-on times and a precise switch-on threshold of the protection circuit for the integrated circuit and the protective effect thereof for different forms of disturbance pulses are important aspects of the product specification and constitute a competitive advantage.

U.S. Pat. No. 5,982,601 discloses a thyristor (SCR—silicon control rectifier) for ESD protection, which is triggered directly by the transient signal. The thyristor is realized in the semiconductor arrangement in a manner known per se by means of an n-type well, a p-type well and highly doped n-type and p-type regions. The transient voltage is detected by means of an RC element. By means of inverters connected downstream, the voltage level detected at the capacitance is converted into a control signal which drives the base of the pap transistor of the thyristor structure. As soon as the output current of the then active pnp transistor generates a sufficiently large voltage drop at a resistor, the npn transistor of the thyristor structure turns on, so that the transient pulse is dissipated from the pad potential of the I/O pin to reference potential through the low-impedance thyristor path. The thyristor then automatically remains turned on until its current falls below the holding current and the turn-off condition is met.

SUMMARY

A circuit arrangement and a method for protecting integrated semiconductor circuits which enable an improved behavior is disclosed. Furthermore, a circuit arrangement and a method which are in particular also suitable for high-voltage processes or for high-voltage applications is disclosed.

The circuit arrangement has an actively triggered protection circuit and the corresponding method enables the thyristor structure to be turned on rapidly. Furthermore, the circuit arrangement can be integrated in high-voltage applications which are produced using high-voltage processes.

Embodiments of the circuit arrangement are explained in more detail below on the basis of exemplary embodiments in connection with the figures. Identical or identically acting elements are provided with the same reference symbols in the figures.

DESCRIPTION OF THE DRAWINGS

In the figures;

FIGS. 2A-2B show schematic representations of a circuit arrangement comprising a protection circuit and a trigger circuit.

FIG. 3 shows a schematic representation of a circuit arrangement comprising a protection circuit and a trigger circuit.

FIG. 4 shows a schematic representation of a circuit arrangement comprising a protection circuit and a trigger circuit.

DETAILED DESCRIPTION

Figure 1A:
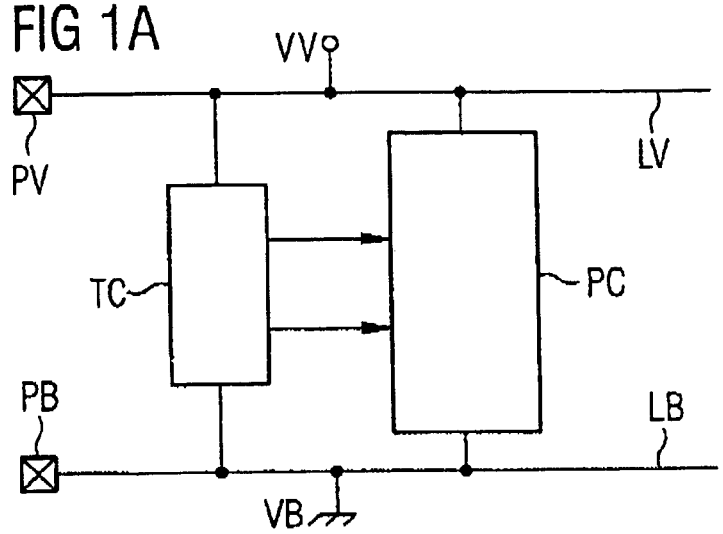
FIGS. 1A-1C show schematic representations of a circuit arrangement comprising a protection circuit and a control or a trigger circuit.

In accordance with FIG. 1a, a terminal PV is connected to a line Lv, which is at a potential W. The potential W may be e.g. the positive supply potential VDD or the potential of an input/output terminal (110 pad). The terminal PV and the line LV are to be protected against transient pulses or against overvoltage. Said overvoltage must be dissipated to a reference potential VB, which may be the ground potential, by way of example. The line LB carrying the reference potential VB is connected to the terminal PB.

The actual task of dissipating disturbance pulses or overvoltages is fulfilled by the protection circuit PC, which is designated as SCR in all the exemplary embodiments. The protection circuit PC or SCF is controlled or triggered by a control circuit TC, which is connected to the terminals PV and PB on the input side. The control circuit TC contains a detector circuit, which is able to identify the transient pulses occurring at the terminal PV or on the line and to generate control signals for the protection circuit PC or SCR.

The control circuit TC generates a plurality of control signals which in each case drive an active element of the protection circuit PC or SCR. In FIG. 1 these are the signals CTL and CTH, which drive the transistors T1 and T2, respectively. The active elements of the protection circuit PC or SCR are generally connected up in such a way that, in the event of driving by the control signals of the trigger or control circuit TC, they produce a low-impedance connection between the line LV or the terminal PV and the reference potential VB. In this case, the protection circuit PC or SCR may also dissipate higher currents to reference potential VB.

In the typical application situation in FIG. 1, the protection circuit PC or SCR contains a thyristor structure. A thyristor is a four-layer component, represented as two bipolar transistors connected up to one another in the equivalent circuit diagram. In the case of a fault, the control circuit TC actively drives the two transistors T1 and T2 (T10 and T20 in FIG. 4 and FIG. 5) of the thyristor structure of the protection circuit with two control signals. For this purpose, currents are injected directly into the two base-emitter junctions.

The turn-on of the protection circuit PC or SCR by means of control signals for the active elements of the protection circuit which, in their interconnection, have to produce the low-impedance connection between the line LV and the line LB is thus initiated in a targeted manner. As a result, it is possible to take the protection circuit PC or SCR into the turned-on state precisely and rapidly. This leads to an improved response behavior of the protection circuit and thus to better protection of the integrated semiconductor circuit, which is illustrated symbolically in FIG. 1 on the basis of the terminals PS and PV and the lines connected thereto.

Figure 1B:
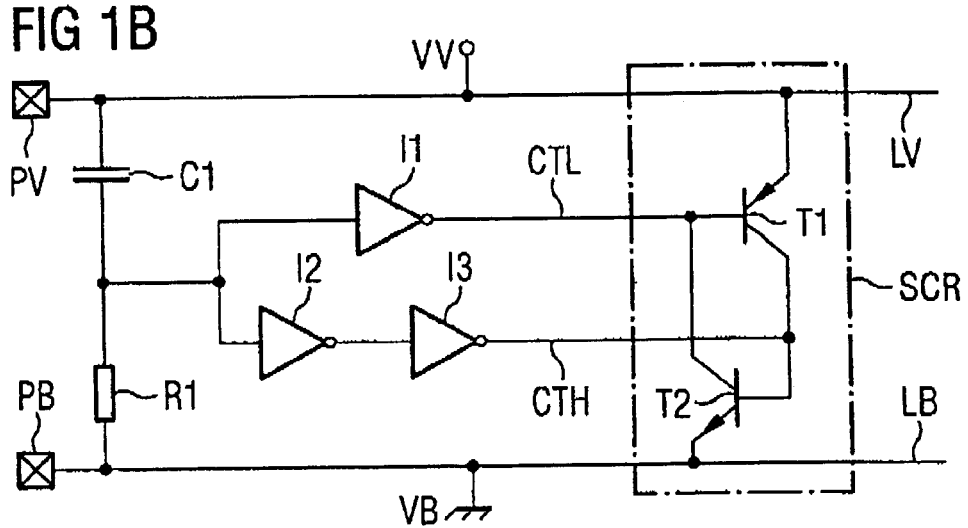

An exemplary embodiment is illustrated in accordance with FIG. 1b). The protection circuit is embodied as a thyristor SCR having the two transistors T1 and T2. T1 is a pnp transistor connected by its emitter to the voltagecarrying line LV, while T2 is an npn transistor connected to the reference potential VB on the emitter side. The collectors of the two transistors are cross-connected to the base of the respective other transistor. In an integrated circuit, a transistor structure of this type may be realized, in a manner known per se by an n-type and p-type well, respectively, having well resistors RN and RP, respectively, and highly doped regions correspondingly arranged therein, see FIG. 6 and schematically FIGS. 3 to 5. The resistors RN and RP are not depicted in FIGS. 1 and 2 for the sake of a better understanding of the mode of operation of the circuit arrangement.

In FIG. 1b), the control circuit is realized by a detector circuit with inverters connected downstream. The detector circuit is embodied as an RC element comprising the series circuit formed by a capacitance C1 and a resistor R1, said series circuit being connected to the lines LV and LB and the corresponding terminals PV and PB. Inverters are connected downstream of the connecting node between the capacitance C1 and the resistor R1, which inverters, on the output side, in each case drive the bases of the transistors T1 and T2. In this case, the inverter I1 is connected to the base of the transistor T1 and two series-connected inverters I2 and I3 are connected to the base of the transistor T2. The inverters are necessary in order to convert the potential present at the connecting point between the capacitance C1 and the resistor R1 into defined control signals CTL and CTH, which drive the transistor elements of the thyristor SCR.

The detector circuit comprising capacitance C1 and resistor R1 forms, as an RC element, a complex voltage divider, at the center tap of which the voltage rise of the disturbance pulse is detected. In the fault situation of a transient pulse, the capacitance C1 attains low impedance, so that a high potential is established at the output point of the detector circuit. As soon as the voltage reaches the switching threshold of the inverter I1, the output signal CTL thereof switches to low potential, so that the pn junction between emitter and base of T1 exceeds the switching threshold and T1 turns on.

On the other hand, the series-connected inverters I2 and I3, which convert the voltage signal detected at the tapping node of the detector circuit into a defined control signal CTH for driving the npn transistor T2, are connected in parallel with I1. Consequently, T2 switches over into the conducting state virtually simultaneously with T1. As a result, the thyristor SCR becomes conducting and the transient pulse present on the line LV or the terminal PV can be dissipated to reference potential.

Figure 1C:
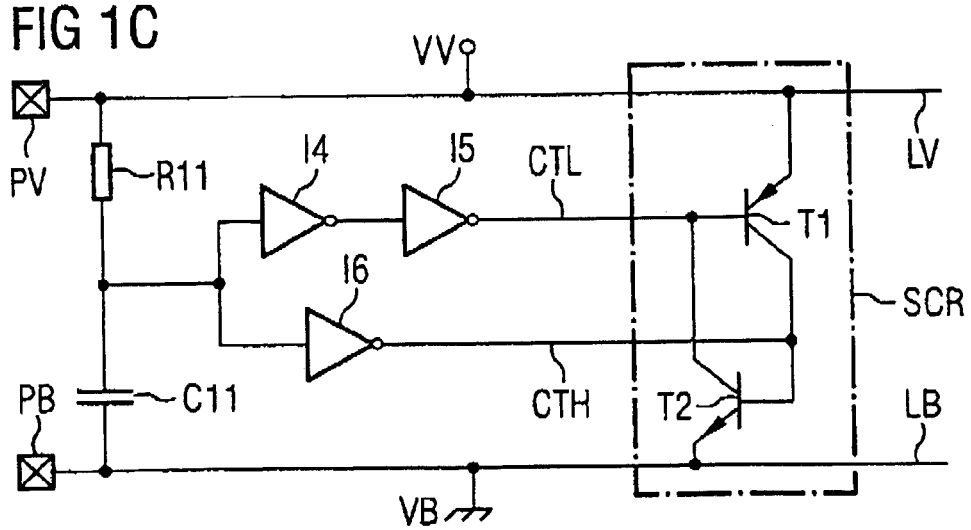

The exemplary embodiment in accordance with FIG. 1c) differs from the exemplary embodiment according to FIG. 1b) by virtue of the fact that the detector circuit comprising the capacitive and resistive components is connected to the terminals PV and PB in a reversed direction. In this case, the resistor R11 is connected to the terminal PV and the capacitance C11 is connected to the terminal PB. Consequently, the voltage conditions at the output of the detector circuit, namely the connecting point between R11 and C11, are reversed, so that the transistors T1 and T2 must also be driven differently. Therefore, the series circuit comprising the inverters I4 and I5 is connected downstream of the output of the detector circuit in order to drive the transistor T1. In parallel with said inverters, the inverter I6 is connected downstream of the output of the detector circuit, and drives the transistor T2.

In the fault situation of a transient pulse, the capacitance C11 attains low impedance, so that a low potential is established at the output point of the detector circuit. The inverter I6 converts said low potential into a voltage required for activating the transistor T2, or a corresponding control current. On the other hand, the series-connected inverters I4 and I5 convert the output voltage at the capacitance C11 into a control signal having low potential or a corresponding current, so that the transistor T1 turns on.

The detector circuit is embodied as an RC element in the exemplary embodiments of FIG. 1, but the invention is not restricted thereto. Other embodiments of the detector circuit may also be expedient, as long as the essential function, namely the identification of a transient pulse to be dissipated on the voltage-carrying line LV and the generation of control signals for activating the active elements or semiconductor junctions of the protection circuit, the transistors of the thyristor SCR in the exemplary embodiment, are functionally fulfilled.

What is crucial is that the transient signal is identified, on the one hand, and the thyristor SCR is not triggered during normal operation, on the other hand. The time constant of the RC element determines on the one hand the identification of a transient pulse and also, on the other hand, the time during which the detector circuit is active. A pulse is identified and detected as long as the rise time of the transient disturbance is less than the time constant of the RC element. On the other hand, the time constant, after the pulse has decayed, determines the time after which the detector circuit becomes inactive and switches off or reverts to normal operation again.

For this purpose, in the exemplary embodiments of FIG. 1, the RC element is set with its time constant such that these conditions are met. Since, in these exemplary embodiments, the thyristor is only triggered in the case of a fault, but need not be switched off, it suffices to identify the rising edge of a transient pulse.

In the case where the RC element respectively has a small capacitance, for example realized as gate oxide capacitance, the impedance of said capacitance becomes low during transient processes, so that, in the exemplary embodiment of FIG. 1b), the output of the RC element is brought to high potential very rapidly, while the output of the detector circuit in FIG. 1c) is brought to low potential very rapidly. In the case of small voltage changes and in the case of DC voltage, the impedances of the capacitances of the RC element act as high-impedance components in both exemplary embodiments, so that in FIG. 1b) the output of the detector circuit is held at low potential, while it is held at high potential in the circuit according to FIG. 1c).

The circuit arrangements of FIG. 2 show a second exemplary embodiment. In contrast to the exemplary embodiments shown in FIG. 1, an additional circuit is provided in the circuit arrangements from FIG. 2, which additional circuit determines how long the control circuit remains active. It is thereby possible to ensure that the control signals of the control circuit activate the thyristor SCR at least until the transient pulse on the line LV or the terminal PV has certainly decayed.

In comparing the exemplary embodiment according to FIG. 2a) with the exemplary embodiment of FIG. 1b) the difference is that an additional circuit is arranged between the first RC element comprising the elements C12 and R12, which detects the transient pulse on the voltage-carrying line LV or the terminal PV and activates the control circuit, and the inverters for driving the thyristor SCR. In this case, firstly the inverters I1, I2 and I3 according to the exemplary embodiment of FIG. 1b) correspond in this order to the inverters I20, I30 and I40 in FIG. 2a). The function of these inverters in FIG. 2a) is identical to that of the inverters of the first exemplary embodiment, but the dimensioning and the realization of the inverters may be embodied in a different manner.

As an element of the additional circuit, an inverter I10 is connected downstream of the output of the first RC element comprising R12 and C12, and drives a PMOS transistor P10. On the output side, said transistor is connected to the voltage-carrying line LV, on the one hand, and to the inputs of the inverters I20 and I30, on the other hand. There is furthermore connected to the latter connecting point the parallel circuit of a second RC element comprising the capacitance C21 and the resistor R21, which are connected by their other terminal in each case to the reference potential VB or the line LB.

In the case of a transient disturbance on the line LV or the terminal PV, this is identified by the first RC element. The output of said first RC element, which drives the inverter I1, assumes high potential in the case of a fast pulse rise through the capacitance C12 then at low impedance, so that the inverter I10 is brought to low potential on the output side. As in the exemplary embodiments of FIG. 1, the rise time of the transient disturbance on the line LV must in this case be shorter than the time constant of the first RC element.

The output of the inverter I10, which is then at low impedance, activates the PMOS transistor P10, the output of which puts the inverter inputs of the inverters I20 and I30 at high potential. As already explained on the basis of the exemplary embodiment of FIG. 1b) the transistors T1 and T2 are subsequently activated, so that the thyristor SCR becomes conducting and can dissipate the pulse on the line LV to reference potential.

The time constant of the second RC element comprising the elements C21 and R21 can be set independently of the time constant of the first RC element and in this situation determines how long the control circuit remains active and generates control signals to the transistors T1 and T2. As long as P10 remains turned on, the inverters I20, I30 and I40 are able to generate the control currents for turning on the transistors T1 and T2. As soon as P10 switches off, e.g. because the transient pulse flattens out and the time constant of the first RC element becomes shorter than the voltage changes on the line LV, the connecting node between the inputs of the inverters I20 and I30 and the second RC element is discharged to reference potential via said RC element and the time constant thereof. The time constant of the second RC element is typically set such that the control circuit outputs the control signals to the thyristor for as long as the transient disturbance lasts. This means that the time constant of the second RC element is greater than the time constant of the first RC element. In this way, different transient pulse forms can be detected and dissipated by means of the first and second RC elements. Furthermore, the time constants of the two RC elements can be optimized with regard to their function independently of one another.

FIG. 2b) differs from the exemplary embodiment of FIG. 2a by virtue of the fact that the inverters are embodied in concrete terms as CMOS inverters I11, I21, I31 and I41.

It goes without saying that the exemplary embodiment with a second RC element can also be adapted to the first exemplary embodiment according to FIG. 1c.

The actively triggered protection circuit concepts described above make use of inverters. The inverters supply the voltages or currents with the necessary short signal rise times in order to trigger the actual protection circuit.

The use of inverters in high-voltage applications is in turn not completely unproblematic. High-voltage components produced using high-voltage processes often have asymmetrical operating parameters or operating conditions as a result of the nature of the high-voltage process, in particular the multiple isolation wells. By way of example, the maximum permissible drain-source voltage of a MOS transistor may be considerably higher than the corresponding maximum permissible gate-bulk voltage. Therefore, specific component configurations, such as e.g. standard inverters, cannot be produced for the possible voltage ranges.

In accordance with a third exemplary embodiment, the control circuit in FIG. 3 is realized by a detector circuit with control transistors TH1 and TE1 connected downstream as output switching elements. The detector circuit contains two subcircuits, one of which drives the transistor T1 and the other of which drives the transistor T2. In principle, in this case, too, each detector subcircuit contains, for transient identification, an RC element comprising the series circuit formed by a capacitance and a resistor, said RC element being connected to the lines LV and LB and the corresponding terminals PV and PB.

Each detector subcircuit comprising a capacitance and resistor forms, as an RC element, a complex voltage divider, at the center tap of which the voltage rise of the disturbance pulse is detected. In the fault situation of a transient pulse, as described, the (complex) impedance of the capacitance becomes low ("low impedance"), so that a low or high potential is established at the output node of the detector circuit depending on the polarity of the RC circuit. As soon as the node voltage reaches the switching threshold of the detector transistor (TD1 and TD2, respectively), the latter turns on and generates at its output a potential which can drive and turn on the control transistors (TH1 and TL1). The output voltages of the switched control transistors have the effect that the pn junction between emitter and base of T1 and T2, respectively, exceeds the switching threshold and the protection circuit turns on.

The detector subcircuit for driving T1 is embodied from the series circuit formed by a capacitance C13 and a resistor R13. The transistor TD1 is connected downstream of the connecting node between the capacitance C13 and the resistor R13. TD1 is embodied as a p-channel transistor. TD1 drives the n-channel control transistor TL1 on the output side. TL1 is connected to the base of T1 on the output side.

In the case of a transient disturbance, the impedance of C13 becomes low, so that TD1 turns on and the output of TD1 assumes high potential, in particular VV, and activates TL1. The output of TL1 and the base of T1 are thereby connected to reference potential VS and T1 turns on.

The detector subcircuit for driving T2 differs from the detector subcircuit for driving T1 by virtue of the fact that the RC series circuit comprising the capacitive component and the resistive component is connected to the terminals PV and PB in a reversed direction. In this case, the resistor R2 is connected to the terminal PB and the capacitance C2 is connected to the terminal PV. Consequently, the voltage conditions at the output of the detector circuit, namely the connecting point between R2 and C2, are reversed, so that the transistor T2 must also be driven differently.

The transistor TD2 is connected downstream of the connecting node between the capacitance C2 and the resistor R2. TD is embodied as an n-channel transistor. TD2 drives the p-channel control transistor TH1 on the output side. TH1 is connected to the base of T2 on the output side.

In the case of a transient disturbance, the impedance of C2 becomes low, so that TD2 switches and the output of TD2 assumes low potential, in particular VB, and can activate TH1. The output of TH1 and the base of T2 are thereby connected to high potential W and T2 turns on.

Other embodiments of the detector circuit may also be expedient as long as the essential function described above is fulfilled.

What is crucial is that the transient signal is identified, on the one hand, and the thyristor SCR is not triggered during normal operation, on the other hand. The time constant of the RC element determines the identification of a transient pulse.

T2 then switches over into the conducting state simultaneously or virtually simultaneously with T1. As a result, the thyristor SCR becomes conducting and the transient pulse present on the line LV or the terminal PV can be dissipated to reference potential. It goes without saying that it is also possible to set different time constants if this necessity should arise.

The elements R3, C3 and R4, C4 illustrated in FIG. 3 determine how long the control circuit remains active or after what time the protection circuit SCR is switched off again. It is thereby possible to ensure that the control signals of the control circuit activate the thyristor SCR at least until the transient pulse on the line LV or the terminal PV has certainly decayed.

The parallel circuit of a further RC element comprising the capacitance C3 and the resistor R3 is thus connected between the base terminal of the transistor TL1 and reference potential VB. The parallel circuit of an RC element comprising the capacitance C4 and the resistor R4 is connected between the base terminal of the transistor TH1 and high potential VV.

The time constants of the RC element comprising the elements C3, R3 and C4, R4, respectively, can be set independently of the assigned time constant of the RC element comprising C13, R13 and C2, R2, respectively, and determine how long the control circuit remains active and the control signals are present at the transistors T1 and T2. As long as TL1 and TH1 remain turned on, TL1 and TH1 can generate the control currents for turning on the transistors T1 and T2, respectively.

As soon as the transient pulse flattens out and the time constant of the RC elements comprising C13, R13 and C2, R2, respectively, become shorter than the voltage changes on the line LV, the inputs of TD1 and TD2 are connected to high potential and reference potential, respectively, via said RC elements and their time constants. TD1 and TD2 switch off.

The time constants R3, C3 and R4, C4 are typically set such that the control circuit outputs the control signals to the protection circuit for as long as the transient disturbance lasts. According to the time constants of C3 and R3, and C4 and R4, respectively, with transistors TD1 and TD2, respectively, switched off, the inputs of the control transistors TL1 and TH1, respectively, are inhibited and the control currents of T1 and T2 are switched off.

Different transient pulse forms can be detected and dissipated by way of the setting of the time constants. Furthermore, the time constants of the RC elements can be optimized with regard to their function independently of one another.

FIG. 4 shows a fourth exemplary embodiment, which differs from the exemplary embodiment of FIG. 3 essentially by virtue of the fact that additional gate driver transistors are used. An improvement of the switching behavior of the control or 15 trigger transistors TH10 and TL10 thus becomes possible.

As a result of the use of the gate driver transistors, it is necessary, in comparison with FIG. 1, to adapt the elements of the control circuit to the polarity of the control signals. The use of transistor T11 as a gate driver for TD10 requires a polarity reversal of the detecting RC element, so that C10 is connected to VV and R10 is connected to VB. The n-channel driver transistor T12 in the output circuit of TD10 drives the p-channel switching transistor TH10 and the latter in turn drives T20. The same applies correspondingly to the second detector subcircuit for R20, C20 and the driver transistor T21, which form the detector input circuit for the detector transistor TD20. The p-channel driver transistor T13 in the output circuit of TD20 drives the n-channel switching transistor TL10 and the latter in turn drives T10. For the design of the RC elements, the explanations with respect to FIG. 1 are correspondingly applicable.

For the exemplary embodiments of FIGS. 3 and 4, the control circuit for detecting the transient event and for driving T1 and T2 is constructed from two partial circuits or subcircuits which are assigned separately to each of the transistors T1 and T2. The separate embodiment of the subcircuits of the control circuit enables these partial circuits to be dimensioned and optimized independently.

Figure 5:
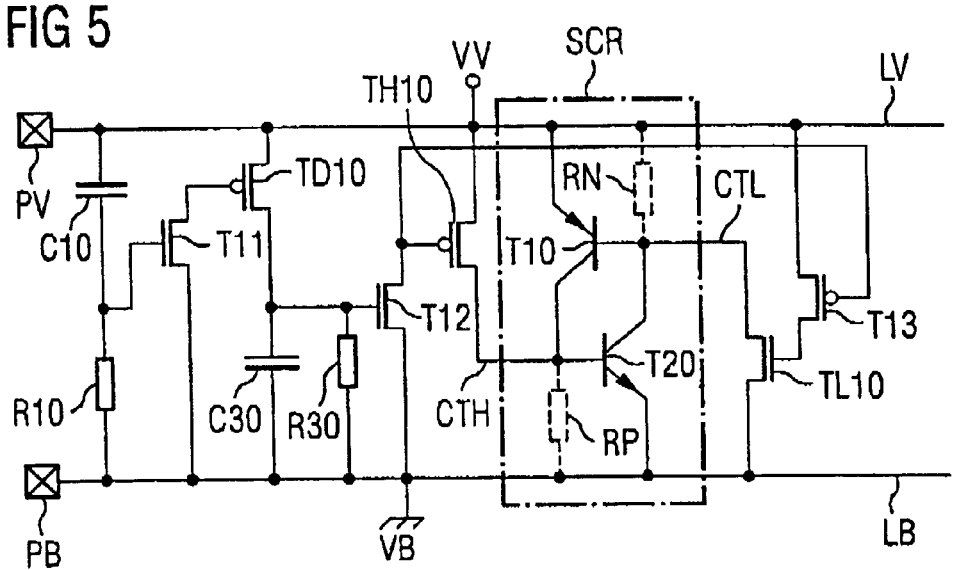
FIG. 5 shows a schematic representation of a circuit arrangement comprising a protection circuit and a trigger circuit.

The further exemplary embodiment in accordance with FIG. 5 differs from the exemplary embodiment of FIG. 4 by virtue of the fact that the two control transistors TL10 and TH10 with driver transistors T13 and T12, respectively, connected upstream use the same detector circuit. In this case, T12 serves not only for driving TH10, but also for driving the gate driver transistor T13 and the switching element TL10 connected downstream. The elements C10, R10, T11, TD10 and also C30, R30 are provided only once in the protection circuit. The elements R20, C20, R40, C40, TD20 and T21 of the second detector subcircuit can thus be omitted.

In the exemplary embodiment in accordance with FIG. 5, although independent dimensioning of the detector partial circuits is omitted, because the detector circuit is present only once, independent dimensioning of the detector subcircuits is in many cases not desirable or not necessary if identical time constants are desired for the driving of TIC and T20. On the other hand, the circuit enables the significant reduction and the optimization of the area requirement of the protection circuit on the semiconductor chip. It is still possible, however, to independently dimension and optimize the control transistors TH10 and TL10 and their driver transistors T12 and T13, respectively.

In accordance with this embodiment, as a result of the use of individual transistors in the control circuit no inverters are required in order to trigger the protection circui't SCR. It is possible to optimize the individual transistors which are used as switching elements of the control circuit in any process for producing the integrated circuit, in particular in high-voltage processes, but also in standard processes. Consequently, an optimized protection circuit can be produced even using a highvoltage process as well as in low-voltage processes.

It goes without saying that the invention is not restricted to the use of MOS transistors as switching elements. Bipolar transistors may likewise be used as switching elements.

Further embodiments of the control circuit and of the protection circuit are possible and, although not illustrated, are included within the scope of protection of the invention.

Figure 6:
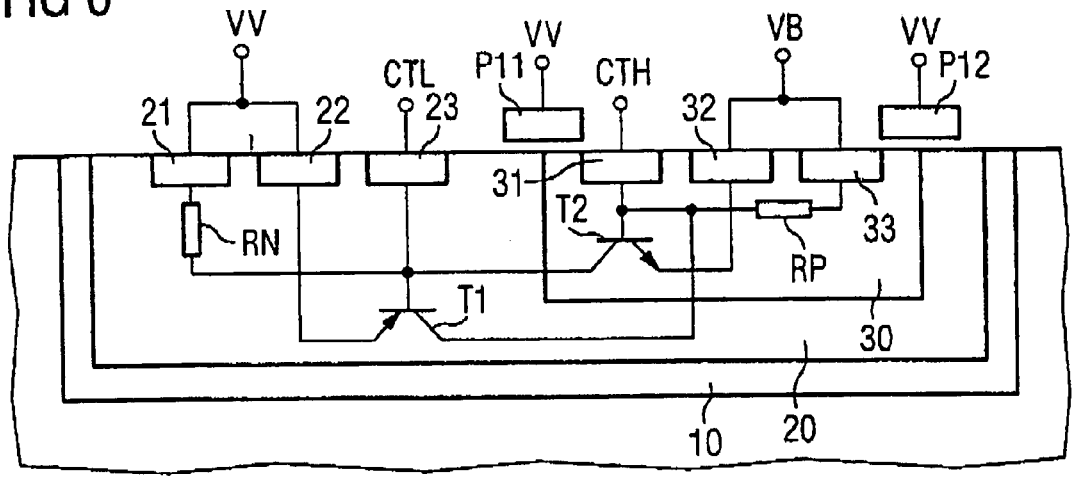
FIG. 6 shows a schematic cross section through a structure for realizing the thyristor in a high-voltage process.

The structure of the protection arrangement in the semiconductor component is specified by the exemplary embodiment in accordance with FIG. 6. A lightly p-doped well 10 is arranged in the semiconductor, which is not illustrated in specific detail. The well 10 may also be the substrate of the semiconductor. An n-doped well 20 is arranged in the well 10. The thyristor made from T1 and T2 is embedded in the n-type well 20 using a high-voltage process in the exemplary embodiment. In this case, the n-type well 20 serves for controlling the high voltages that occur.

Highly doped regions having p-type or n-type conductivity are arranged in the well 20; they can be produced in a customary manner for example by implantation or diffusion. The highly doped n-type region 21 and also the highly doped p-type region 22 may be connected separately to a potential, but they must have the same potential during operation. For this purpose, they are in each case connected to the high potential VV. The highly doped n-type region 23 is connected to the output CTL of the control circuit.

A p-doped well 30 is likewise arranged in the n-type well 20. Two highly doped p-type regions 31 and 13 and also a highly doped n-type region 32 are arranged in said well 30. These regions may be produced in a conventional manner by implantation or diffusion in a similar manner to the highly doped regions of the n-type well. The regions 32 and 33 may be connected separately to a potential, but they must have the same potential during operation. For this purpose, in the example they are in each case connected to the reference potential VB. The region 31 is connected to the output CTH of the control circuit.

Field plates P11 and P12 made of polysilicon (typically as a poly1 layer) are formed above the boundary regions of the n-type well 20 and the p-type well 30. The field plates serve for controlling the electric field at the high operating voltages and increase the breakdown voltage of the arrangement. This results in lower susceptibility of the circuit to incorrect triggering.

The parasitic thyristor structure comprising the transistors T1 and T2 is depicted in the n-type well and p-type well, respectively. Accordingly, the collector of the npn transistor T2 is produced between the region 21 with downstream resistance RN of the n-type well 20 and the region 23. The base is produced from the region 31 and the collector T1 and is connected to reference potential VB via the resistance RP of the p-type well 30. The base of said transistor T2 is connected to the region 31 as a control terminal to which the control signal CTH for switching the transistor on and off can be applied. The emitter is produced as region 32.

The base of the pnp transistor T1 is produced between the region 21 and the downstream bulk resistance RN of the n-type well 20 and the collector of the transistor T2 or the region 23 at which the signal CTL is present. The collector of T1 is produced between the terminal 33 with downstream bulk resistance RP of the p-type well 30 and the region 31. The emitter of the transistor T1 is connected to the region 22. The control signal CTL serves for switching the transistor T1 on and off.

The control, lines or control signals CTL and CTH are firstly put at low potential (region 23) and high potential (region 31), respectively, in order to switch the transistors T1 and T2 on. A base current is respectively provided in this case for the pnp transistor and the npn transistor. The base currents switch the respective transistor on and thus trigger the thyristor. The protection function is thus in operation between the lines LV and LB.

In order to switch the thyristor off, the region 23 is connected to high potential via the terminal CTL after the control transistor TL1 has been switched off, by means of the bulk resistance RN, and the region 31 is connected to low potential via the terminal CTH after the control transistor TH1 has been switched off, by means of the bulk resistance RP. The transistors T1 and T2 thus turn off and thus turn off the thyristor.

The invention claimed is:

1. A circuit arrangement for protecting an integrated semiconductor circuit comprising:
   a protection circuit located between an element to be protected and a reference potential, the protection circuit comprising a thyristor structure that includes active elements; and
   a control circuit configured to drive the protection circuit by generating a plurality of control signals to drive one or more active elements of the protection circuit, the control circuit comprising:
      a detector circuit in parallel with the protection circuit;
      a first resistive-capacitive (RC) element, the first RC element comprising a resistor and a capacitor;
      an additional circuit arranged downstream from the detector circuit;
      a driver circuit that couples the additional circuit to the thyristor; and
      a second RC element comprising a second resistor and a second capacitor, the second RC element being electrically connected to a connecting point between the additional circuit and the driver circuit.

2. The circuit arrangement of claim 1, wherein the switching elements comprise inverters.

3. The circuit arrangement of claim 1, wherein the active elements comprise active elements of different conductivity types and the plurality of control signals comprise a plurality of control signals for the active elements of different conductivity types, the control signals having opposite polarities that are based on conductivity types of active elements, the control signals being configured to drive control inputs of the active elements.

4. The circuit arrangement of claim 1, wherein the detector circuit of the control circuit is configured to identify a signal with a predetermined rise time at the element to be protected.

5. The circuit arrangement of claim 1, wherein the control circuit comprises a plurality of time-dependent elements configured to determine a duration of activation of the control circuit.

6. The circuit arrangement of claim 5, wherein the time-dependent elements comprise resistive-capacitive (RC) elements.

7. The circuit arrangement of claim 1, wherein the detector circuit and the switching elements each comprise individual transistors.

8. The circuit arrangement of claim 1, wherein the detector circuit is configured to identify a signal with a predetermined rise time at the element to be protected, the predetermined rise time being a detection criterion of the detector circuit.

9. The circuit arrangement of claim 8, wherein the control circuit comprises at least some time-dependent elements configured to determine a duration of activation of the control circuit.

10. The circuit arrangement of claim 8, wherein the detector circuit comprises at least one resistive-capacitive (RC) element, the at least one RC element comprising a resistor and a capacitor.

11. The circuit arrangement of claim 1, wherein the detector circuit comprises two detector subcircuits, each of the detector subcircuits configured to drive a switching element for the active elements of the protection circuit.

12. The circuit arrangement of claim 1, wherein the switching elements comprise individual metal oxide semiconductor (MOS) transistors.

13. The circuit arrangement of claim 1, further comprising switching elements and driver elements, the switching elements being electrically connected to the driver elements.

14. The circuit arrangement of claim 1, wherein control inputs of the active elements of the protection circuit comprise a semiconductor structure that includes wells of different conductivity types, the wells including highly doped regions for output circuits of the active elements.

15. A method for protecting an integrated semiconductor circuit, the method comprising:
   detecting a state of an element to be protected using a protection circuit located between the element to be protected and a reference potential, the protection circuit comprising a thyristor structure that includes active elements;
   using a control circuit to generate a plurality of control signals based on a detected state of the element to be protected, the control circuit comprising:
      a detector circuit configured to identify a transient pulse;
      a first resistive-capacitive element;
      a second resistive-capacitive element configured to determine how long the control circuit remains active; and
      communicating the control signals to a control input of the active elements of the protection circuit.

16. The circuit arrangement of claim 6, wherein the RC elements are configured to generate control signals for controlling a beginning of activation and an end of activation of the control circuit.

17. The circuit arrangement of claim 7, wherein the switching elements each comprise individual bipolar transistors.

18. The circuit arrangement of claim 1, wherein upon detection of a detection criterion, the control circuit is configured to drive switching elements that are configured to generate the control signals.

19. A circuit arrangement for protecting an integrated semiconductor circuit comprising:
   a protection circuit located between an element to be protected and a reference potential, the protection circuit comprising a thyristor structure that includes active elements, the thyristor structure being represented by a first and a second bipolar transistor; and
   a control circuit configured to drive the protection circuit by generating a plurality of control signals to drive one or more active elements of the protection circuit, the control circuit comprising a detector circuit in parallel with the protection circuit; wherein the detector circuit comprises:
      a first subcircuit comprising:
         a first resistive-capacitive element comprising a first capacitor and a first resistor; and
         a first detector transistor connected downstream from the first resistive-capacitive element; and
      a second subcircuit comprising:
         a second resistive-capacitive element comprising a second capacitor and a second resistor; and
         a second detector transistor electrically connected downstream from the second resistive-capacitive element; and
   wherein the first subcircuit is configured to drive the first detector transistor and the second subcircuit is configured to drive the second detector transistor.

20. The circuit arrangement of claim 1, wherein the additional circuit comprises one element from a group comprising an inverter and a transistor, and the driver circuit comprises one element from a group comprising an inverter and a transistor.

* * * * *